United States Patent [19]
Cochran et al.

[11] Patent Number: 5,119,326
[45] Date of Patent: Jun. 2, 1992

[54] WAVESHAPING TRANSVERSAL FILTER AND METHOD UTILIZING THE SAME FOR DATA TRANSMISSION OVER COAXIAL CABLE

[75] Inventors: William T. Cochran, Milford; Joseph R. Yudichak, Madison; Daniel C. Upp, Southbury, all of Conn.

[73] Assignee: TranSwitch Corporation, Shelton, Conn.

[21] Appl. No.: 447,093

[22] Filed: Dec. 6, 1989

[51] Int. Cl.$^5$ .......................... G06F 15/31; G06G 7/02
[52] U.S. Cl. ................................. 364/825; 364/724.16
[58] Field of Search ................. 364/825, 724.2, 724.16; 333/18, 166; 375/80, 16, 60

[56] References Cited

U.S. PATENT DOCUMENTS

| | | | |
|---|---|---|---|
| 3,803,501 | 4/1974 | Jones, Jr. ............................... | 375/80 |
| 3,921,072 | 11/1975 | Sato ....................................... | 333/18 |
| 4,323,864 | 4/1982 | Ogawa et al. ......................... | 333/166 |
| 4,438,521 | 3/1984 | Mattei .................................... | 375/16 |
| 4,472,812 | 9/1984 | Sakaki et al. ........................ | 364/724.2 |
| 4,513,427 | 4/1985 | Borriellow et al. ................. | 375/110 |
| 4,773,082 | 9/1988 | Somer et al. .......................... | 375/60 |
| 4,943,789 | 7/1990 | Surie ...................................... | 333/18 |

Primary Examiner—Jerry Smith
Assistant Examiner—Jim Trammell
Attorney, Agent, or Firm—David P. Gordon

[57] ABSTRACT

The transversal filter has a plurality of variable delay lines each having multiple voltage controlled delay stages in series, with one of the variable delay lines having a clock input, and the other variable delay lines having data signal inputs. A phase comparator is coupled to the output of two non-adjacent stages of the variable delay lines having the clock input. A feedback circuit is coupled to the comparator and provides voltage signals to the voltage controlled delay stages of all of the variable dealy lines, such that adjacent stages in a particular delay line are delayed in time equal fractions of a clock cycle from each other, and so that all delay lines are running on the same clock. A voltage weighting circuit is provided for shaping the voltage outputs of the data signal variable delay lines and the weighting circuit is coupled to the delay line stages by switches which are activated when a data signal is propagated through a delay line stage. Where positive pulse, zero pulse, and negative pulse inputs are provided to the transversal filter along with a clock signal, and where the delay lines of the transversal filter have four or more active stages, a substantially raised cosine B3ZS encoded waveform which can be transmitted over a coaxial cable of up to forty hundred fifty feet in length without requiring line build-out can be provided from an incoming B3ZS encoded DS3 signal.

27 Claims, 4 Drawing Sheets

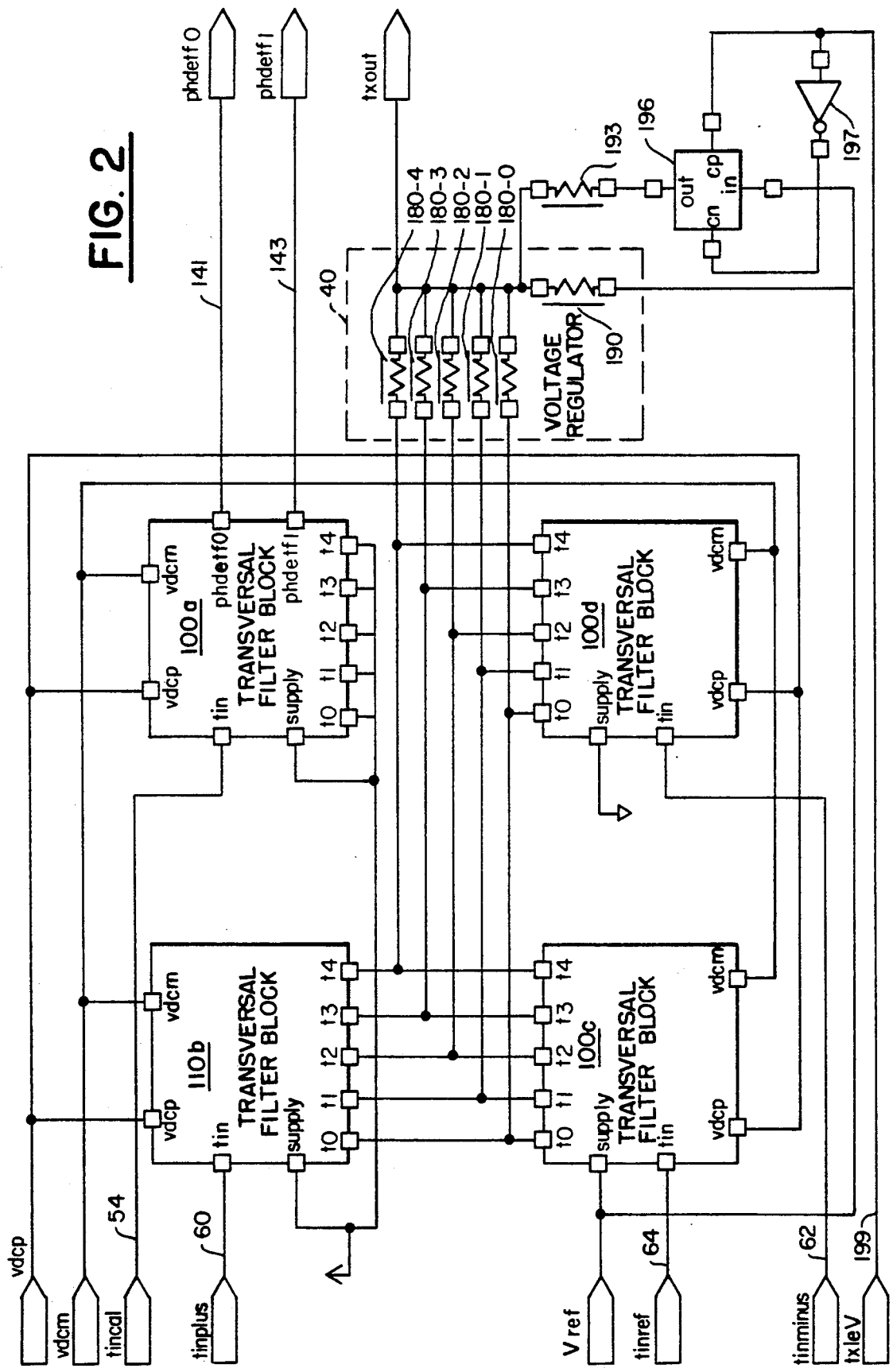

5,119,326

1

WAVESHAPING TRANSVERSAL FILTER AND METHOD UTILIZING THE SAME FOR DATA TRANSMISSION OVER COAXIAL CABLE

BACKGROUND

This invention relates generally to a pulse shaping transversal filter which can be used in lieu of an equalizer in equipment coupled to a coaxial cable. The invention more particularly relates to a transversal filter for creating a raised cosine wave which is transmittable over a coaxial cable to a network interface without requiring line build-out. The invention has particular application to transmittal of data in the DS3 format, although it is not intended to be so limited.

According to present standards, a data communications pulse being received at a network interface over a coaxial cable of up to four hundred fifty feet long must comply with a certain shape and amplitude as set forth in T1E1/88-006R1 dated July 1988. Traditionally, the transmitted pulse shape is in the form of a square wave, and massaging of the pulse is required to assure compliance with standards. The standard means for performing the massaging is "line build out" as is well known in the art.

SUMMARY OF THE INVENTION

It has been found that line build out is not required if the pulse shape is accommodated to the cable. In other words, by properly forming the pulses, a single pulse shape can be utilized such that a proper pulse shape is received at the network interface regardless of cable length (up to 450 feet). The proper pulse shape which obviates line build out is a raised cosine, or a pulse in substantially a raised cosine format. Thus, the broad method of data transmission over a coaxial cable is to obtain an input wave, to filter the input wave according to a preset filter so as to produce a substantially raised cosine waveform, and to transmit the substantially raised cosine waveform over any coaxial cable of up to four hundred fifty feet to the network interface.

The substantially raised cosine waveform is obtained from the transversal filter. The transversal filter has a standard pulse shape input. The standard pulse is then shifted a given increment in time, weighted, and added to itself. This procedure is repeated a number of times to arrive at the desired output waveshape suitable for transmission over the coaxial cable.

It is therefore an object of the invention to provide a method and apparatus for transmitting data over a coaxial cable without provision for line build-out.

It is another object of the invention to provide a method and apparatus for generating a substantially raised cosine pulse shape suitable for transmission over coaxial cable of lengths up to four hundred fifty feet without equalization.

It is a further object to provide a transversal filter capable of generating substantially raised cosine pulses suitable for bipolar data transmission of a coaxial cable.

The transversal filter in accord with the objects of the invention broadly comprises a plurality of variable delay lines each having multiple stages in series, with one of the variable delay lines having a clock input, and at least one of the variable delay lines having data signal inputs, a phase comparator coupled to an output of the variable delay lines with the clock input, a feedback circuit coupled to the comparator and to each of the variable delay lines, and a plurality of weighting circuits coupled via switches to each of the variable delay lines having data signal inputs. Each stage of the variable delay line has at least one transmission gate and at least one inverter in series, and preferably two of each. The phase comparator compares the phase of the signal exiting the variable delay line with the phase of the signal entering the variable delay line and provides a signal indicative thereof. The phase comparator signal is averaged and averaged/inverted by the feedback circuit, and the average and inverted average are fed back to respective gates of each transmission gate of the multiple stages of each variable delay line to control the speed at which data passes through the stages. As a result, data (or clock) signals passing through each stage of the variable delay line are an equal fraction of a cycle delayed at each stage such that the phases compared at the phase comparator are equal. Taps from each stage of the variable delay lines with data signal inputs are routed through the weighting circuits which weight the signal according predetermined weights so as to provide a substantially raised cosine waveform.

Where the signal is a DS3 signal at a frequency of approximately 44.736 MHz, and coded according to the B3ZS code, data must be sent as positive data, negative data, or zero data. As a result, four variable delay lines having multiple stages in series are preferably provided; one each for the positive (i.e. 5 V), negative (i.e. 0 V), and zero data (i.e. 2.5 V), and one for the clock. Only the variable delay line for the clock has a phase comparator and feedback circuit. The feedback voltages generated from the feedback circuit of the clock circuit are fed to the transmission gates of all of the variable delay lines to guarantee equal delay through each stage of the variable delay lines. Taps off each stage of each variable delay line are then fed through switches to the weighting circuits which are basically voltage dividers. Taps off the stages of the variable delay line for the clock circuit are also subject to switches for purposes of providing equalizing capacitance, although those switches are not connected to the weighting circuit.

Additional details and advantages of the invention will become apparent to those skilled in the art upon reference to the detailed description taken in conjunction with the provided Figures.

BRIEF DESCRIPTION OF THE DRAWINGS

FIG. 2 is a detailed block diagram of a portion of the transversal filter of FIG. 1;

DETAILED DESCRIPTION OF THE PREFERRED EMBODIMENTS

Figure 1:
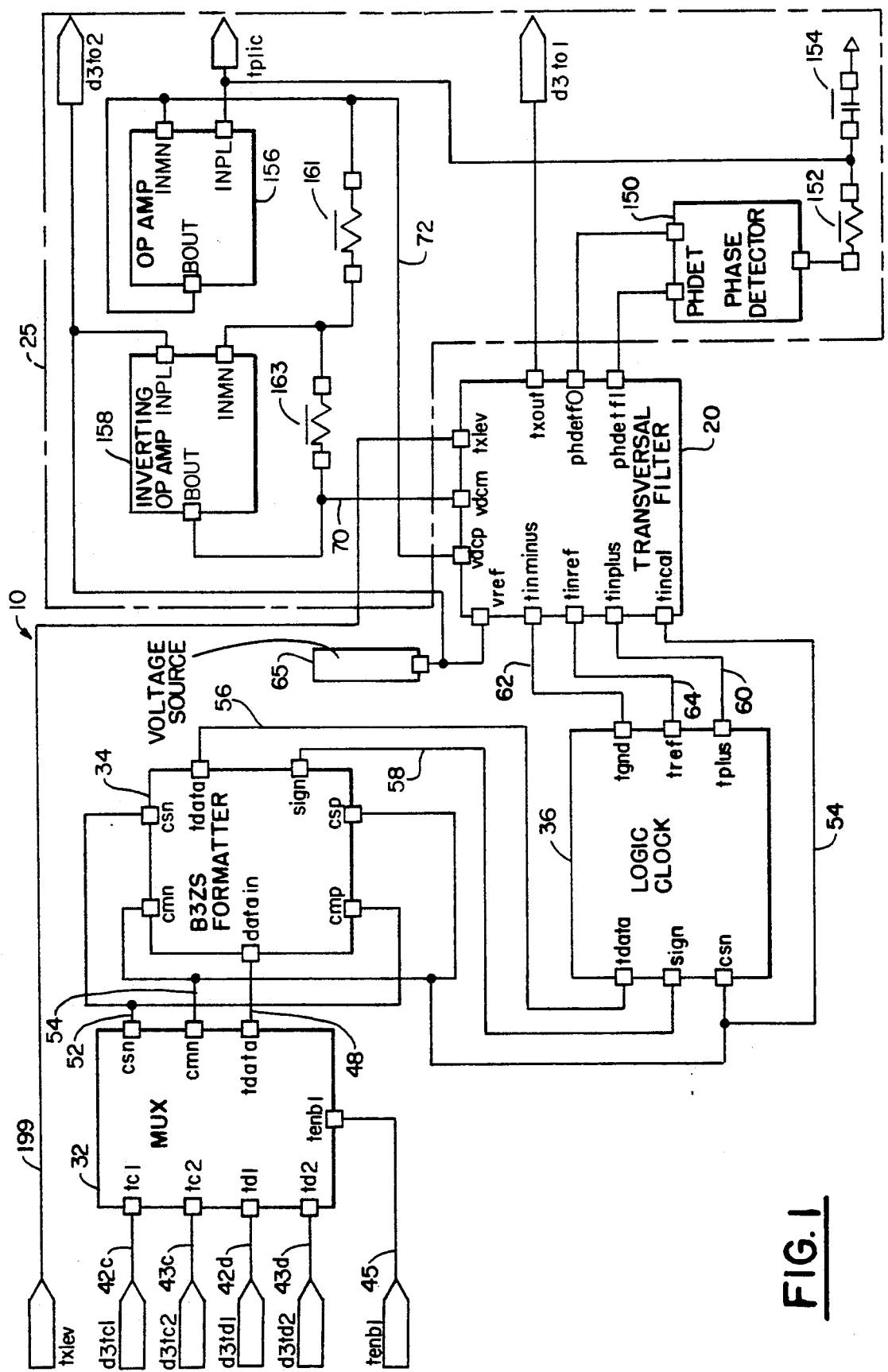
FIG. 1 is a block diagram of an apparatus for taking a square wave and producing B3ZS substantially raised cosine waves therefrom.

The preferred apparatus as seen in FIGS. 1-3 relates to a device which receives a DS3 signal which includes data and clock, and which generates a substantially raised cosine waveform in B3ZS format for transmission over a coaxial cable to a network interface. For purposes herein the term "substantially raised cosine" means any waveform which is intended to approximate a raised cosine or a similar wave in shape, or any waveform which may be transmitted over coaxial cables of lengths up to four hundred fifty feet and still meet the T1E1/88-006R1 standards for a network interface pulse shape without additional shaping. It will be appreciated by those skilled in the arts, that the apparatus and methods disclosed herein may be useful for other waveforms required by other standards, and there is no intent that the invention be limited to only DS3 signals, or to the B3ZS convention.

As seen in FIG. 1, the apparatus 10 of the invention is comprised of the transversal filter 20, and associated feedback circuitry 25, with additional prefiltering and post-filtering circuitry provided. including a prefiltering multiplexer 32, B3ZS format block 34, and logic block 36, and a post-filtering voltage regulating circuit 40. The prefiltering circuitry basically instructs the transversal filter as to whether it should output a positive or negative substantially raised cosine pulse, or a zero pulse. As will be described hereinafter, for a B3ZS raised cosine signal, four variable delay lines are desired in the transversal filter 20, with each delay line comprised of four or more stages. All of the delay lines should be located on the same integrated circuit chip to help guarantee identical parameters and delay.

In the preferred embodiment, the multiplexer 32 is provided as the interface into the circuit. Multiplexer 32 is standard in format. It receives data and clock inputs 42c, 42d, and 43c, 43d in DS3 square wave format from two sources, and uses a control input 45 to determine which of the data and clock input pairs is to be passed along. The outputs of multiplexer 32 include the square wave data signal 48, and two clock signals 52 and 54 (csn and cmn) of alternate polarity, but of the same frequency as the chosen clock input.

The data and clock signals output from the multiplexer 32 are fed to an B3ZS encoder 34 of standard format. The B3ZS encoder takes the incoming signal and generates a data output 56 and a sign signal 58 which are based on the incoming data and which comply with the B3ZS coded format. The B3ZS encoder is clocked according to the two phase clock pair cmn and csn.

The data and sign outputs of the B3ZS encoder (as well as clock cmn) are forwarded to the logic block 36 which outputs one of three possible signals in response thereto. If the data signal 56 is a "1" and the sign signal 58 is a "1", the logic block 36 produces a pulse indicative of a positive signal (tplus) at 60. If the data signal 56 is a "1", and the sign signal 58 is a "0", the logic block 36 produces a pulse indicative of a negative signal (tgnd) at 62. Finally, if the data signal 56 is a "0", the logic block 36 produces a pulse indicative of a zero signal (tref) at 64, regardless of the value of the sign signal 56.

The pulses indicative of positive, negative, and zero signals are all coupled to the transversal filter 20 of the invention. Other inputs into the transversal filter 20 include a reference voltage vref (e.g. 2.5 V) obtained from a voltage source 65, an input clock 54 related (via clock cmn) to the input clock into the multiplexer, and as will hereinafter be described, feedback voltages 70 and 72.

Turning to FIG. 2, additional detail of the transversal filter is seen. Basically, the transversal filter 20 is comprised of four internally identical blocks 110a, 110b, 110c, and 110d. Each block 110, however, has different signal and voltage inputs, as well as different output line connections. The signal input into block 110a is clock 54, and the voltage input which controls the output voltage of the output signals of block 110a is tied to a positive voltage rail Vdd (not shown). The data input into block 110b is the positive signal pulse 60, and the voltage input is also tied to the positive voltage rail. The input into block 110c is the zero or reference signal pulse 64, and the voltage input is tied to the voltage source 65. The input into block 110d is the negative or ground signal pulse 62, and the voltage input is tied to ground. The outputs of blocks 110 will be described hereinafter.

Figure 3A:
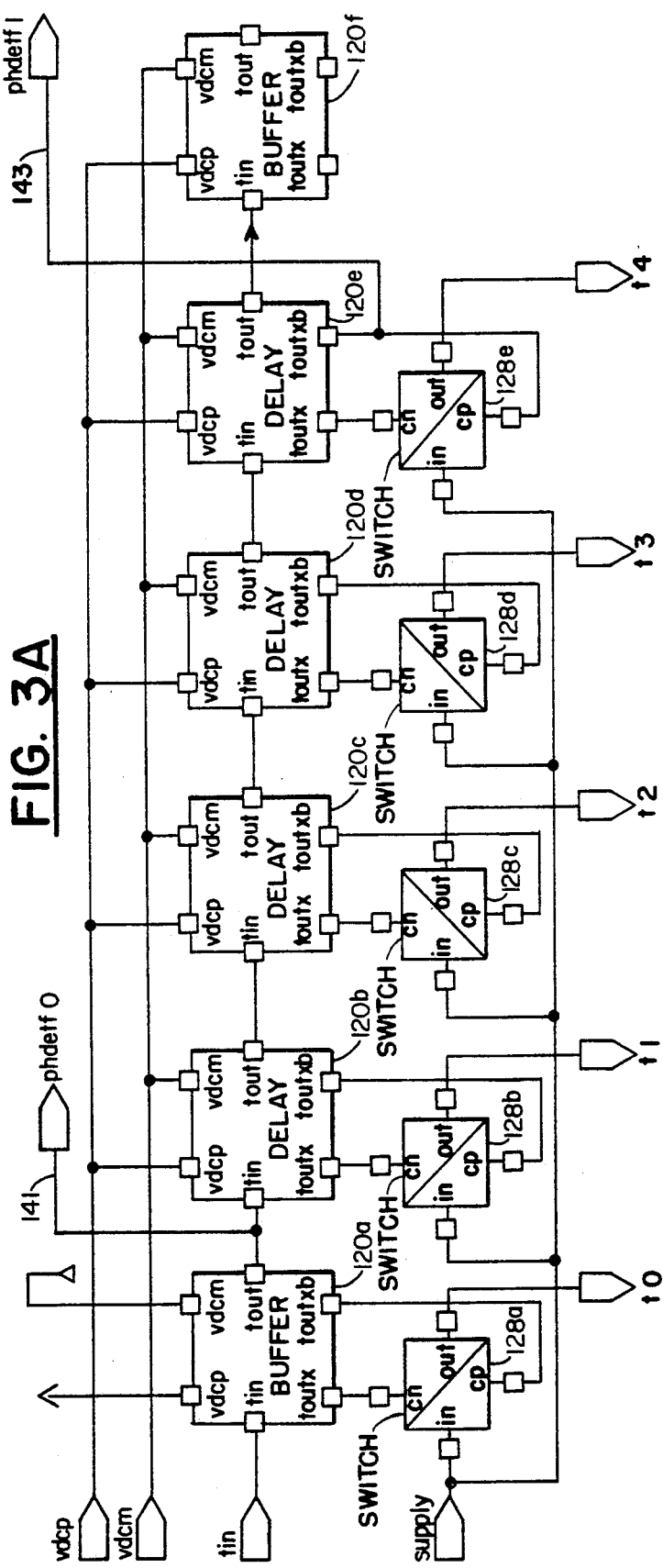
FIG. 3a is a detailed block diagram of the multiple stage variable delay line and associated switches which are part of each block of FIG. 2.

The internals of each block 110 is seen with reference to FIG. 3a where a six stage delay line is seen. The first and last stages 120a and 120f are preferably buffer stages, and stages 120b-120e act to provide delay outputs as will be described hereinafter. Each stage 120 includes a delay circuit 125 which is shown in FIG. 3b, as well as a switch 128 which permits the voltage associated with the particular delay line to be switched to the voltage divider circuit.

Figure 3B:
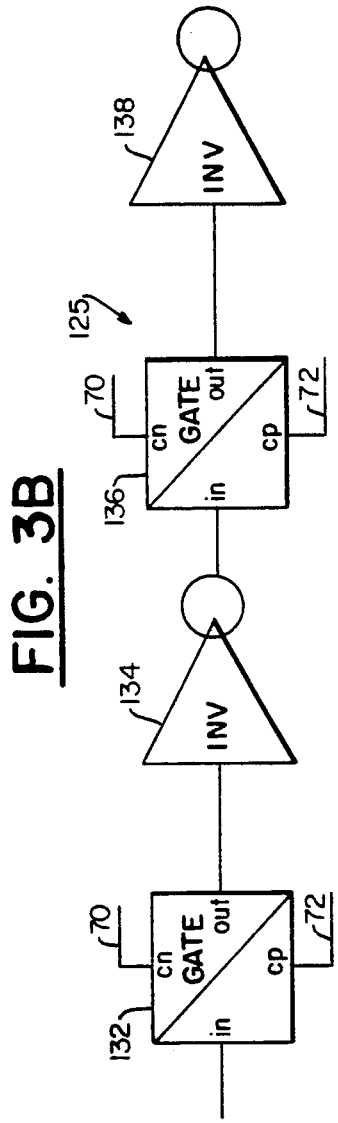
FIG. 3b is a schematic diagram of the a single stage of a variable delay line.

Referring to FIG. 3b where the details of the preferred delay circuit are seen, each delay circuit preferably comprises a CMOS transmission gate 132 having an n-type and a p-type CMOS transistor in parallel, followed by an inverter 134, followed by another CMOS transmission gate 136, followed by another inverter 138. As indicated, the feedback voltages 70 and 72 are applied to the respective gates of the n-type and p-type CMOS transistors. The application of a voltage difference across the gate leads of the CMOS transmission gates controls the delay through the transmission gates 132 and 136, as CMOS device are voltage sensitive. By providing a plurality of the delay circuits of FIG. 3b in parallel as shown in FIG. 3a, a single variable delay line is provided.

As shown in FIG. 2, block 110a, which has the DS3 clock as its data input, has two outputs 141 and 143 which are related to the phase of the clock signal as tapped from locations shown in FIG. 3a. In particular, the DS3 clock signal is loaded into buffer stage 120a which basically experiences no delay as a 5 V voltage difference is applied to the gates of the n-type and p-type CMOS transistors which help constitute the buffer stage. The buffer stage 120a (as well as output buffer stage 120f) is provided so that the other stages 120b-120e will see equal input and output impedances (i.e. for balancing). Because buffer stage 120a provides no delay, the output of stage 120a is considered to be at time zero in the cycle of a single clock pulse (i.e. t0=0). The clock signal from the data output of stage 120a provides a first phase detection point and provides phase output 141. As the clock signal is transferred down the array of stages, the signal is delayed somewhat due to the voltage difference across each transmission gate not being a full five volts. The output from the fifth stage 120e, which provides four delay times, is taken as the second phase output 143. The phase outputs 141 and 143 are then compared by a phase detector 150 (see FIG. 1) which is part of feedback circuitry 25.

Phase detector 150 compares the phases of the signals from the output of stages 120a and 120e, the signal from one of the stages being inverted prior to comparison, and provides a signal in response thereto. The signal is provided to the RC circuit comprised of resistor 152 and capacitor 154 which is coupled to ground. The RC circuit takes the pulse from the phase detector 150 and provides an average direct current signal. The direct current signal is then provided to an op amp 156 of unity gain which serves to buffer the RC circuit from block 110a. The output of op amp 156 is fed to an inverting op amp 158 (having gain of minus one provided by resistors 161 and 163) as well as to the gates of all n-type transistors of transmission gates 132 and 136, while the output of op amp 158 is fed to the gates of all p-type transistors of transmission gates 132 and 136. In other words, the feedback circuit 25 coupled to block 110a, is used to create feedback voltages which are applied to all transmission gates of each stage of each block where delay through the stage is desired.

As in most feedback type circuits, the goal of the feedback circuit 25 is to stabilize the transversal filter. Stabilization occurs by eliminating any phase difference between the phases of the signals being received at the phase detector 150. When the phase difference is eliminated such that the phase at the output of stage 120a is the inverse of the phase at the output of stage 120e, the feedback circuit is in equilibrium. In equilibrium, the clock input into block 110a is delayed by equal fractions of a half a clock cycle by each stage 120 provided each stage of the block is identical and has identical output impedances. Because the transversal filter circuit is an integrated circuit, the make-up of each stage is guaranteed to be virtually identical. Also, by providing identical switches 128 coupled to each stage 120, the impedances on the outputs are guaranteed to be virtually identical. Thus, where four stages are provided as part of the delay line (after the initial buffer stage 110a and before the terminating buffer stage 110f) as in the preferred embodiment, the clock signal at the output of each stage 120 is one eighth (i.e. one quarter of one half) of a clock cycle removed from the clock signal at the output of the preceding stage. If five active stages were provided, the clock signal at each stage would be one tenth of a clock cycle removed from the clock signal at the preceding stage. Regardless, stages of equal fractions of a clock delay are generated and are used as a calibration for the delay lines not having the feedback circuit.

Returning to FIG. 3a, it is seen that switches 128 are CMOS switches which are provided with three inputs and a single output. A first input into switches 128 is the supply voltage as discussed with reference to FIG. 2. The second and third inputs are voltage inputs from corresponding stages of the delay line which are sent to the n and p gates of the CMOS switch. As the data pulse into the delay line propagates through the delay line, on the leading edge of the pulse, the associated switch 128 is turned on, while on the trailing edge of the pulse, associated switch 128 is turned off. Thus, as a data pulse propagates through a delay line, the supply voltage provided to switches 128a–128e is provided at the output of the switches during the length of the data pulse. Because the data pulse is delayed, the voltage at the outputs of each of switches 128a–128e are delayed one eighth of a clock cycle with respect to the previous adjacent output.

Each of the switches 128 of delay lines 110b, 110c, and 110d are coupled to the post-filtering voltage regulating circuit 40 which essentially comprises a voltage summing and divider circuit, and acts in conjunction with the signals output from the delay lines to shape an output wave. As seen in FIG. 2, each output from delay lines 110b, 110c, and 110d is summed with outputs from the other delay lines which correspond in time delay; i.e. the t0 outputs are all connected, the t1 outputs are all connected . . . The summed outputs are fed through parallel resistors 180-0, 180-1, 180-2, 180-3, and 180-4 which act as the first resistor in a voltage divider with resistor 190 which is coupled to the reference voltage of 2.5 V. By appropriately choosing values for resistors 180 and resistor 190, a substantially raised cosine waveform can be generated. For sake of completeness, it should also be noted that another resistor 193 is provided in parallel with resistor 190 to cause the amplitude of the output voltage txout to decrease for short lines. Thus, a control signal txlev 199 (transmit level) is provided as an input to switch 196 and inverter 197. When txlev 199 is low, switch 196 turns on and effectively places resistor 193 in parallel with resistor 190. When txlev is high, switch 197 turns off and effectively provides an infinite resistance, such that the resistance of resistors 190 and 193 in parallel is equal to the resistance of resistor 190.

According to the preferred embodiment of the invention resistors 180 and resistor 190 are chosen such that the relative conductance values of resistors 180-0 through 180-4 are 0.7, 0.5, 1, and 0.7 respectively. These values are then scaled to the conductance of resistor 190 to give an appropriate output voltage. With these conductance values, it has been found via numerical summations that a substantially raised cosine waveform is generated with both polarities with the provided delay lines having outputs of five volts (Vdd), two and one half volts (Vref), and zero volts (gnd). In particular, the output voltage txout from the voltage regulating circuit 40 is determined according to the following equation:

$$txout = \sum_{n=0}^{4} \left( \frac{tn/R(180-n)}{[1/R(190)] + \sum_{k=0}^{4} 1/R(180-n)} \right) + \frac{Vref/R(190)}{[1/R(190)] + \sum_{k=0}^{4} 1/R(180-k)}$$

where tn is the voltage output from the n'th stage of the active delay line switched via switch 128n, and R( ) symbolizes the resistance of the appropriate resistor 180-0 through 180-4 or resistor 190. The sum in the denominator is simply the sum of the conductances of resistors 180 plus the conductance of resistor 190. By way of example only, if the denominator has a value of ten mhos, the numerator is the voltage value of a given output tn weighted with the conductance of its connected resistor. Txout is referenced to a fraction of Vref since resistor 190 is connected to vref and not to ground. Assuming a zero pulse signal as a starting point, where block 110c is providing Vref sequentially at its outputs, the output voltage txout is exactly 2.5 vols (Vref) since there is no current flow in any of the resistors 180. Then, assuming a positive output voltage at time t0, the voltage at the t0 output of block 110b goes to five volts (Vdd). The output is then defined according to the formula:

$$txout = (5 \times 0.7/10) + (2.5 \times 1/10) + (2.5 \times 0.5/10) + (-2.5 \times 1/10) + (2.5 \times 0.7/10) + (2.5 \times 6.1/10)$$

or $$txout = 2.675 \text{ volts.}$$

One eighth clock cycle later, the voltage at the t1 output of block 110b goes to 5 V, followed by the t2 voltage one eighth of a clock cycle after that, etc. By half a clock cycle, when the positive pulse reaches a maximum, the voltage at the t1–t4 outputs are all high, with the switch 128 at t0 stage of block 110b turning off as the switch at the t4 stage 110b and the switch at the t0 stage of block 110c (2.5 V) turn on. Thus, over half a clock cycle, the voltage at the output of the voltage regulating circuit continues to climb from 2.675 to 2.925, 3.05, and 3.30 volts respectively for each eighth clock cycle. Then, as the positive pulse propagates through block 110b, in successive eighth cycles, the five volt t1, t2, t3, and t4 outputs of block 110b are turned off, while the two and one half volt outputs of t1, t2, t3, and t4 of the block 110c are turned on causing the voltage to decrement successively from 3.3 to 3.05, 2.925, and 2.675 volts until the 2.5 V "zero" pulse value is reached and the raised cosine wave of a complete cycle is completed.

If the next pulse is another positive pulse, the same cycle is repeated. If the next pulse is a "zero pulse", all of the switches on the outputs of block 110c are sequentially turned on again, and an even 2.5 V signal is applied across all of the resistors 180. If the next pulse is a negative pulse, the outputs of block 110d are activated, with zero volts being applied to resistors 180-0, 180-1 . . . in succession, as the 2.5 V values are successively switched off. As a result, as the negative wave propagates through delay block 110d, the voltage at the circuit output decreases from 2.5 to 2.325, 2.075, 1.95 and 1.7 volts. Then, on the second half of the negative square wave, where a "zero" value is entered, the 2.5 V outputs of block 110c are turned back on as associated outputs of block 110d are turned off, and the voltage at the circuit output increases from 1.7 to 1.95, 2.075, 2.325 and 2.5 volts. At the end of the negative pulse cycle, the negative raised cosine wave of a complete cycle is completed.

Figure 4A:
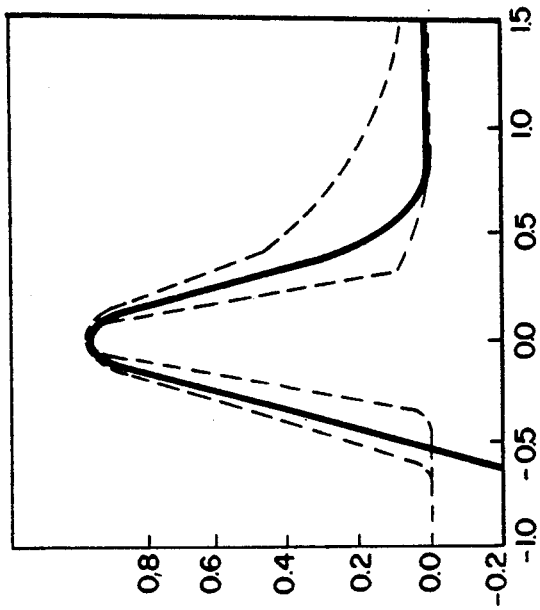
FIG. 4a is a wave shape diagram showing the permissible pulse shapes at a network interface as defined by T1E1/88-006R1.
Figure 4B:
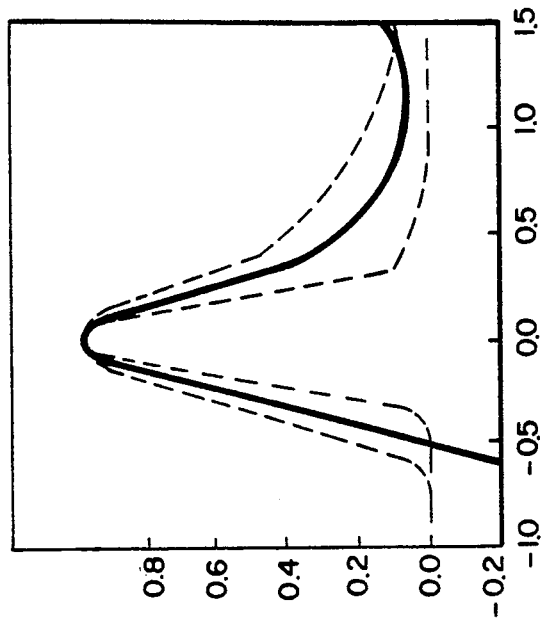
FIGS. 4b-4d are respectively a wave shape generated by the apparatus of FIGS. 1-3, and resulting waveforms received at a transmission network interface (0 feet), and after transmission through a 120 foot and a 450 foot coaxial cable.
Figure 4C:
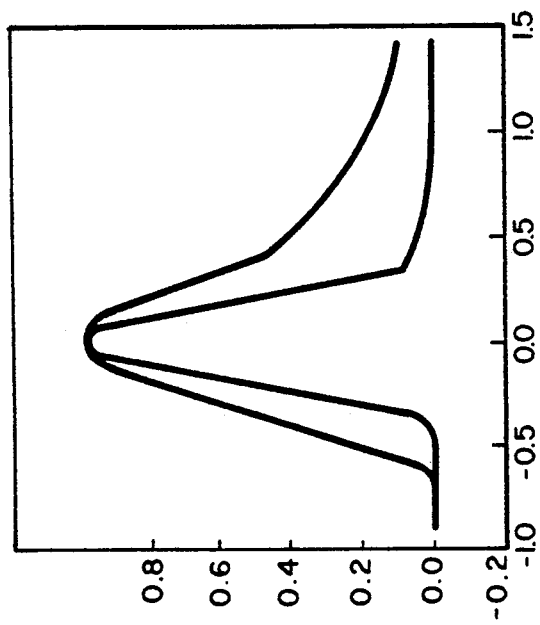
Figure 4D:
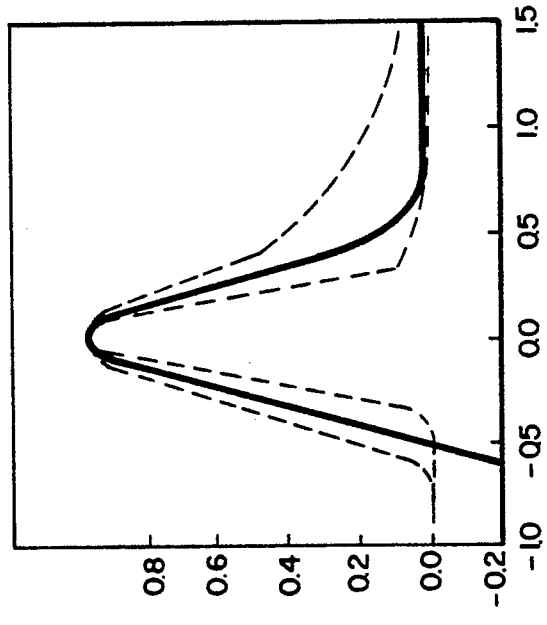

Turning to FIGS. 4a–4d, it is seen that the waveform (FIG. 4b) generated by the circuit of FIGS. 1–3 and transmitted through both a one hundred twenty foot coaxial cable and a four hundred fifty foot coaxial cable, provides waveforms (FIGS. 4c and 4d) which fall within the pulse shape guidelines seen in FIG. 4a. Thus, a raised cosine waveform, which was generated from three input voltages, and from a transversal filter which generates four equal delays per half cycle (effectively creating a sampling at eight times the clock rate), can be sent over any coaxial cable meeting published specifications such that the signal received at the network interface meets published specifications.

There has been described and illustrated herein a transversal filter for creating a raised cosine wave which is transmittable over a coaxial cable to a network interface without requiring line build-out. The method invention is closely related thereto. While particular embodiments of the invention have been described, it is not intended that the invention be limited thereby, as it is intended that the invention be broad in scope and that the specifications be read likewise. For example, while the invention was described with relation to a B3ZS encoded DS3 signal, it will be appreciated the invention applies to other square wave input signals. Also, while three input voltages were utilized, desired output signals can be created from two or more input voltages. Similarly, while delay lines generating signals one-eighth cycle apart were described, delay lines having three or more stages for generating signals one-third or more cycles apart may have useful application. Indeed, other types of output signals can be generated. Further, while CMOS switches and delay elements formed as transmission gates were described and illustrated, those skilled in the art will appreciate that different arrangements for delay elements and switches can be provided with CMOS technology, and other transistor technology such as bipolar or BiCMOS could be utilized. Likewise, while particular relative values for resistors were provided according to the preferred embodiment, it will be appreciated that other relative values could be utilized to provide a substantially raised cosine waveform. Therefore, it will be apparent to those skilled in the art that other changes and modifications may be made to the invention as described in the specification without departing from the spirit and scope of the invention as so claimed.

We claim:

1. A transversal filter for taking a square wave clock signal and at least two different data voltage value signals indicative of a desired signal, and creating a substantially different waveform representing said desired signal therefrom, said transversal filter comprising:
   a) at least three delay lines each comprised of at least three substantially identical stages in series, each stage having a voltage controlled delay means, a first of said delay lines being a clock signal delay line which is coupled at its input to said clock signal, and second and third of said delay lines coupled to respective of said two different data voltage value signals;
   b) phase comparator means coupled to the clock signal delay line at the outputs of two different non-adjacent stages of the clock signal delay line, for comparing the phases of signals at said outputs and providing at least one feedback signal indicative thereof;
   c) feedback circuit means coupled to said phase comparator and to said voltage controlled delay means, for applying said at least one feedback signal as at least one voltage control signal to each voltage controlled delay means of each stage of each delay line, whereby said at least three delay lines are thereby calibrated such that each corresponding stage of each delay line is an equal fraction of a clock cycle delayed in time relative to a preceding adjacent stage; and
   d) a plurality of switch means, one each for each stage of said second and third delay lines, wherein when a data voltage value signal is applied to its delay line, the switch means for a particular stage is turned on when said data voltage value signal propagates to said particular stage, and turns off when said data voltage value signal is no longer present at said particular stage.

2. A transversal filter according to claim 1, wherein:

said plurality of switch means includes a switch means for each stage of said first delay line.

3. A transversal filter according to claim 1, further comprising:
   e) a voltage regulating circuit coupled to said switch means of the data voltage value signal delay lines, wherein corresponding stages of data voltage value signal delay lines are coupled together.

4. A transversal filter according to claim 3, wherein: said voltage regulating circuit comprises a plurality of parallel first resistors and at least one second resistor in series with said parallel first resistors, each parallel first resistor being coupled to a coupled set of corresponding stages.

5. A transversal filter according to claim 4, wherein: said first resistors are weighted relative to each other to provide a substantially raised cosine waveform at a junction between said first resistors and said second resistor when one of said data voltage value signals pulses the delay line coupled thereto.

6. A transversal filter according to claim 1, wherein: said at least three delay lines comprises four delay lines, with said second delay line coupled to a positive pulse signal, said third delay line coupled to a zero signal, and a fourth delay line coupled to a negative pulse signal.

7. A transversal filter according to claim 6, wherein: said at least three substantially identical stages in series comprises at least four substantially identical stages in series.

8. A transversal filter according to claim 7, wherein: said four delay lines each include at least four substantially identical stages in series, preceded and followed in series by a buffer stage of substantially identical format to said four stages; and
   each substantially identical stage is comprised of a first CMOS transmission gate coupled in series to a first inverter coupled in series to a second CMOS transmission gate coupled in series to a second inverter.

9. A transversal filter according to claim 8, further comprising:
   e) a voltage regulating circuit coupled to the switches of said positive, negative, and zero pulse delay lines wherein outputs of corresponding stage switches of said positive, negative, and zero pulse delay lines are coupled together.

10. A transversal filter according to claim 9, wherein: said voltage regulating circuit comprises a plurality of parallel first resistors and at least one second resistor in series with said parallel first resistors, each parallel first resistor being coupled to a coupled set of stage switches.

11. A transversal filter according to claim 10, wherein:
   switches coupled to the stages of said positive pulse delay line are coupled to a high voltage source, and provide high voltage outputs to said voltage regulating circuit when the stages associated with those switches are pulsed;
   switches coupled to the stages of said zero pulse delay line are coupled to a reference voltage source, and provide a middle voltage outputs to said voltage regulating circuit when the stages associated with those switches are pulsed;
   switches coupled to the stages of said negative pulse delay line are coupled to a low voltage source, and provide low voltage outputs to said voltage regulating circuit when the stages associated with those switches are pulsed.

12. A transversal filter according to claim 11, wherein:
   said high voltage source provides a five volt potential;
   said reference voltage source provides a two and one half volt potential; and
   said low voltage source provides a zero volt potential.

13. A transversal filter according to claim 12, wherein:
   said first resistors are weighted relative to each other to provide a substantially raised cosine waveform at a junction between said first resistors and said second resistor when either said positive delay line is provided with said positive pulse signal or said negative voltage delay line is provided with said negative pulse signal.

14. A transversal filter according to claim 13, wherein:
   each substantially identical stage is comprised of a first CMOS transmission gate coupled in series to a first inverter coupled in series to a second CMOS transmission gate coupled in series to a second inverter, wherein each CMOS transmission gate is provided with first and second voltage input terminals.

15. A transversal filter according to claim 14, wherein said feedback circuit comprises an RC circuit coupled to said phase comparator means, a first amplifier coupled to said RC circuit, and a second amplifier coupled to said first amplifier, said RC circuit for providing a substantially dc voltage signal to said first amplifier, said first amplifier for buffering said voltage signal from said transversal filter, wherein the output of said first amplifier is provided to said first voltage input terminal of each CMOS transmission gate, and said second amplifier for inverting the substantially dc voltage signal, wherein the output of said second amplifier is provided to said second voltage input terminal of each CMOS transmission gate.

16. A transversal filter according to claim 13 in conjunction with prefiltering circuitry, for receiving DS3 data and associated clock signals and providing a substantially raised cosine B3ZS encoded signal for transmission over a coaxial cable, said prefiltering circuitry including a B3ZS encoder for receiving said DS3 data signal and encoding said DS3 data signal, and a logic circuit coupled to said B3ZS encoder for providing said positive pulse, zero, and negative pulse signals, said DS3 clock signal constituting said square wave clock signal.

17. A transversal filter according to claim 6 in conjunction with prefiltering circuitry, for receiving DS3 data and associated clock signals and providing a substantially raised cosine B3ZS encoded signal for transmission over a coaxial cable, said prefiltering circuitry including a B3ZS encoder for receiving said DS3 data signal and encoding said DS3 data signal, and a logic circuit coupled to said B3ZS encoder for providing said positive pulse, zero, and negative pulse signals, said DS3 clock signal constituting said square wave clock signal.

18. A transversal filter according to claim 1, wherein: each substantially identical stage is comprised of a first CMOS transmission gate coupled in series to a first inverter coupled in series to a second CMOS transmission gate coupled in series to a second inverter, wherein each CMOS transmission gate is provided with first and second voltage input terminals.

19. A transversal filter according to claim 18, wherein:
said feedback circuit comprises an RC circuit coupled to said phase comparator means, a first amplifier coupled to said RC circuit, and a second amplifier coupled to said first amplifier, said RC circuit for providing a substantially dc voltage signal to said first amplifier, said first amplifier for buffering said voltage signal from said transversal filter, wherein the output of said first amplifier is provided to said first voltage input terminal of each CMOS transmission gate, and said second amplifier for inverting the substantially dc voltage signal, wherein the output of said second amplifier is provided to said second voltage input terminal of each CMOS transmission gate.

20. A method for transmitting encoded digital data over a coaxial cable of desired length without providing for line build-out, comprising:
 a) obtaining a digital data signal with an associated clock signal;
 b) encoding said digital data and providing as a result thereof at least three outputs indicative of when a positive pulse is desired, when a negative pulse is desired, and when a zero pulse is desired;
 c) filtering said positive, negative, and zero pulses with a waveshaping transversal filter having said positive, negative, and zero pulses and said clock signal as inputs thereto, so as to produce a substantially raised cosine waveform; and
 d) transmitting said substantially raised cosine waveform over said coaxial cable without providing for line build-out.

21. A method according to claim 20, wherein:
said step of filtering so as to produce a substantially raised cosine waveform includes producing voltage pulse signals of different voltages over time as a result of said filtering, and applying said voltage pulse signals of different voltages to a voltage regulator to produce said substantially raised cosine waveform.

22. A method according to claim 21, wherein:
said step of filtering comprises propagating said clock signal through substantially identical stages of a delay circuit means for said clock signal,
comparing the phase of said clock signal at the outputs of non-adjacent stages in the delay circuit means,
generating at least one feedback signal to each stage of said delay circuit means based on the phase comparison, said at least one feedback signal causing delays through each stage of the delay circuit means to be equal, and
using said at least one feedback signal to control stages of a delay circuit means for the positive, negative, and zero pulses which are substantially identical to the delay circuit means for the clock signal, wherein said voltage pulse signals of different voltages are output from said delay circuit means associated with said positive, negative, and zero pulses.

23. A method according to claim 22, wherein:
said digital data signal is a DS3 data signal, and
said encoding step encodes said DS3 data signal according to a B3ZS format.

24. A method according to claim 22, wherein:
said coaxial cable of desired length is of up to four hundred and fifty feet long.

25. A method according to claim 20, wherein:
said digital data signal is a DS3 data signal,
said encoding step encodes said DS3 data signal according to a BCZS format, and
said coaxial cable of desired length is of up to four hundred and fifty feet long.

26. A transversal filter for taking a square wave clock signal and a data voltage value signal indicative of a desired signal, and creating a substantially different waveform representing said desired signal therefrom, said transversal filter comprising:
 a) at least two delay lines each comprised of at least three substantially identical stages in series, each stage having a voltage controlled delay means, a first of said delay lines being a clock signal delay line which is coupled at its input to said clock signal, and a second of said delay lines coupled to said data voltage value signal;
 b) phase comparator means coupled to the clock signal delay line at the outputs of two different non-adjacent stages of the clock signal delay line, for comparing the phases of signals at said outputs and providing at least one feedback signal indicative thereof;
 c) feedback circuit means coupled to said phase comparator and to said voltage controlled delay means, for applying said at least one feedback signal as at least one voltage control signal to each voltage controlled delay means of each stage of each delay line, whereby said at least two delay lines are thereby calibrated such that each corresponding stage of each delay line is an equal fraction of a clock cycle delayed in time relative to a preceding adjacent stage; and
 d) a plurality of switch means, one each for each stage of said second delay line, wherein when a data voltage value signal is applied its delay line, the switch means for a particular stage is turned on when said data voltage value signal propagates to said particular stage, and turns off when said data voltage value signal is no longer present at said particular stage.

27. A transversal filter according to claim 26, further comprising:
 e) a voltage regulating circuit coupled to said switch means of the data voltage value signal delay line, said voltage regulating circuit comprising a plurality of parallel first resistors and at least one second resistor in series with said parallel first resistors.

* * * * *